(12) United States Patent
Yao

(10) Patent No.: US 8,228,054 B2
(45) Date of Patent: *Jul. 24, 2012

(54) METHOD AND APPARATUS FOR AMPLIFYING A SIGNAL AND TEST DEVICE USING SAME

(75) Inventor: Hong Yao, Shanghai (CN)

(73) Assignee: Fluke Corporation, Everett, WA (US)

( * ) Notice: Subject to any disclaimer, the term of this patent is extended or adjusted under 35 U.S.C. 154(b) by 7 days.

This patent is subject to a terminal disclaimer.

(21) Appl. No.: 13/088,150

(22) Filed: Apr. 15, 2011

(65) Prior Publication Data

US 2011/0193549 A1    Aug. 11, 2011

Related U.S. Application Data

(63) Continuation of application No. 11/881,699, filed on Jul. 26, 2007, now Pat. No. 7,928,721.

(51) Int. Cl.
*G01R 1/30* (2006.01)

(52) U.S. Cl. .................... 324/124; 324/123 C; 330/260; 330/271

(58) Field of Classification Search ............... 324/76.17, 324/124, 123 C
See application file for complete search history.

(56) References Cited

U.S. PATENT DOCUMENTS

| | | | |
|---|---|---|---|
| 3,405,286 A | 10/1968 | Mudie | |
| 3,444,394 A | 5/1969 | Colvson | |
| 3,484,594 A | 12/1969 | Gilbert | |
| 3,852,674 A | 12/1974 | Van Roessel | |
| 4,016,496 A * | 4/1977 | Eastcott | 327/130 |
| 4,243,975 A | 1/1981 | Masuda | |
| 4,495,531 A | 1/1985 | Sasamura | |
| 4,785,237 A * | 11/1988 | Cox | 324/123 R |
| 4,807,147 A * | 2/1989 | Halbert et al. | 702/66 |
| 4,853,639 A * | 8/1989 | Vosteen et al. | 324/457 |
| 5,013,931 A * | 5/1991 | Estes, Jr. | 327/140 |
| 5,250,893 A * | 10/1993 | Gambill et al. | 324/115 |
| 5,386,188 A | 1/1995 | Minneman | |
| 5,515,001 A | 5/1996 | Vranish | |
| 5,930,745 A | 7/1999 | Swift | |
| 6,026,286 A | 2/2000 | Long | |
| 6,441,693 B1 | 8/2002 | Lange | |
| 6,480,178 B1 | 11/2002 | Itakura | |
| 6,828,434 B2 | 12/2004 | Manoharan | |
| 7,253,680 B2 * | 8/2007 | Laletin | 330/69 |
| 7,486,267 B2 * | 2/2009 | Chen et al. | 345/98 |
| 7,932,713 B2 * | 4/2011 | Yao | 324/124 |
| 2008/0084201 A1 | 4/2008 | Kojori | |

* cited by examiner

*Primary Examiner* — Richard Isla Rodas

(74) *Attorney, Agent, or Firm* — Christensen O'Connor Johnson Kindness PLLC

(57) ABSTRACT

An amplifier circuit is used in a multimeter to amplify signals applied between a pair of test terminals. A voltage applied to one of the test terminals is amplified by a first operational amplifier configured as a voltage follower. An output of the first operational amplifier is applied to an inverting input of a second operational amplifier configured as an integrator. An output of the second operational amplifier is connected to the other of the test terminals. A voltage generated at the output of the second operational amplifier provides an indication of the magnitude and polarity of the voltage applied to the first and second test terminals.

14 Claims, 4 Drawing Sheets

METHOD AND APPARATUS FOR AMPLIFYING A SIGNAL AND TEST DEVICE USING SAME

CROSS-REFERENCE TO RELATED APPLICATION

This application is a continuation of U.S. patent application No. 11/881,699, filed Jul. 26, 2007, the entire disclosure of which is hereby incorporated by reference herein.

TECHNICAL FIELD

This invention relates generally to amplifiers for increasing the magnitude of a voltage, and, more particularly, to an amplifier and method having a high input impedance, high bandwidth and high signal-to-noise ratio.

BACKGROUND

Devices for measuring various electrical parameters, such as voltage, current and resistance are in common use. A typical example is a multimeter, which generally can measure AC or direct current ("DC") voltage and current as well as resistance. Multimeters typically include a set of test leads that are adapted to be connected to a pair of test points. The test leads are coupled to an internal amplifier, which drives circuitry for providing information to a read-out device such as an analog meter or a digital display. A typical amplifier circuit 10 is shown in FIG. 1. The amplifier circuit 10 includes an operational amplifier 12 having a non-inverting input connected to ground. An inverting input of the operational amplifier 12 forms a summing junction that is connected to one input terminal 14 of the multimeter through an input resistor 18 and to an output of the operational amplifier 12 through a feedback resistor 20. Another input terminal 24 is connected to ground. As is well-known in the art, the gain of the amplifier 12 is set by the ratio of the resistance of the feedback resistor 20 to the resistance of the input resistor 18.

It is generally desirable for a multimeter to have a very high input impedance. For this reason, the input resistor 18 typically has a very high resistance, such as 1 MΩ. The resistance of the feedback resistor 20 is typically much lower, such as 10 kΩ Therefore, the gain of the amplifier 12 is low. Using the examples given (1 MΩ input resistor 18 and 10 kΩ feedback resistor 20), the gain of the amplifier 12 would be 0.01.

The output of the amplifier 12 is then applied to a high gain amplifier 30. The low gain of the amplifier 12 attenuates the signal to be measured, but, unfortunately, it does not significantly attenuate noise that may be present in the signal or present in the multimeter. Therefore, when the output of the amplifier 12 is boosted by the high gain amplifier 30, the signal-to-noise ratio of the measured signal can be very low.

Another "front end" amplifier circuit 40 that is conventionally used in multimeters is shown in FIG. 2. The circuit 40 also uses an operational amplifier 44 configured as a voltage-follower with its output connected to the inverting input of the amplifier 44. The signal to be measured is applied to the non-inverting input of the amplifier 44 through a resistor 46. The amplifier 44 has a very high input impedance between its inverting and non-inverting inputs. However, to fix the input impedance at a constant, controllable value, an input resistor 48 may be used between the input terminal 14 and ground. The input resistor 48 may have a high resistance value, such as 1 MΩ. Unfortunately, stray capacitance and input capacitance of the amplifier 44, both of which are represented by a capacitor C, forms a low-pass filter with the resistor 46. This low-pass filter can limit the AC response of the amplifier circuit 40. Although the circuit 40 can still be used in the measurement of the voltage and current of DC signals, the low-pass filter can result in measurement errors for AC signals, particularly if the AC signals have a high frequency.

There is therefore a need for a circuit for amplifying a signal to be measured in a manner that results in a high signal-to-noise ratio, a high, stable input impedance and good high frequency performance.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Figure 1:
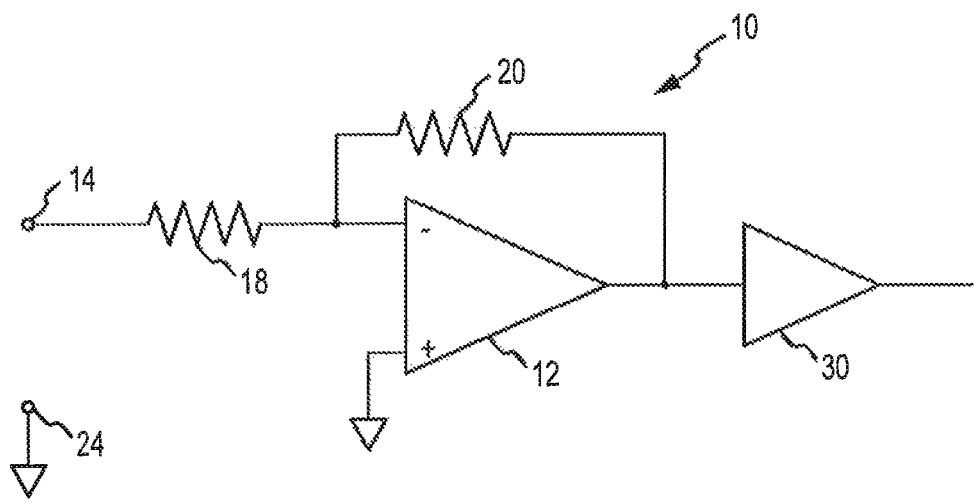
FIG. 1 is an embodiment of a prior art amplifier circuit that is often used in a test and measurement device.
Figure 2:
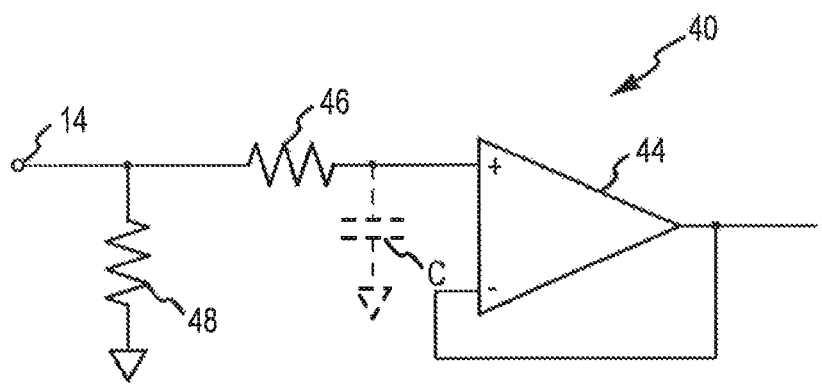
FIG. 2 is another embodiment of a prior art amplifier circuit that is often used in a test and measurement device.
Figure 3:
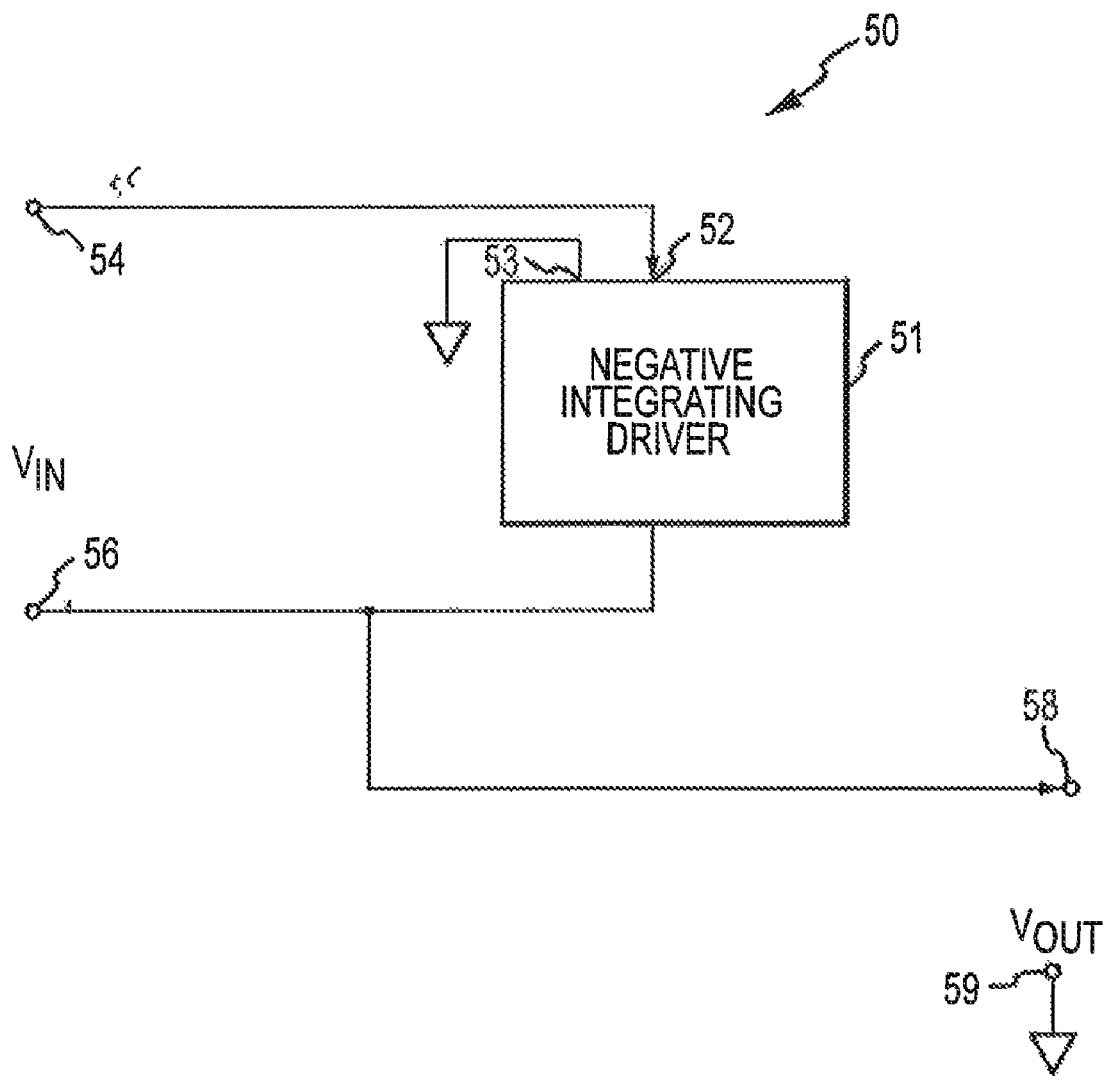
FIG. 3 is an embodiment of an amplifier circuit according to one embodiment of the invention.

An amplifier circuit 50 according to one embodiment of the invention is shown in FIG. 3. The amplifier circuit 50 includes a negative integrating driver circuit 51 having a pair of input terminals 52, 53. One of the input terminals 52 is connected to a first test terminal 54, and the other input terminal 53 is connected to ground. An input voltage $V_{IN}$ to be measured is applied between the first test terminal 54 and a second test terminal 56. The output of the negative integrating driver circuit 51 is connected to the second test terminal 56 and to a first output terminal 58. A second output terminal 59 is connected to ground. An output voltage $V_{OUT}$ generated between the terminals 58, 59 provides an indication of the magnitude the voltage $V_{IN}$ applied to the test terminals 54, 56. The negative integrating driver circuit 51 integrates with respect to time the input voltage $V_{IN}$ applied between the test terminals 54, 56 at a polarity that is opposite the polarity of the input voltage $V_{IN}$. For example, if the input voltage $V_{IN}$ is a constant +5 volts, the output of the negative integrating driver circuit 51 will increase negatively at a constant rate.

The amplifier circuit 50 has the unusual property of having the output of a circuit, i.e., the negative integrating driver circuit 51, connected to an input terminal, i.e., the test terminal 56. In operation, assume the voltage at terminal 56 referenced to ground is initially 0 volts. The voltage at terminal 54 referenced to ground will therefore be equal to the voltage $V_{IN}$ applied between the test terminals 54, 56. This voltage is applied to the negative integrating driver circuit 51, which integrates this voltage negatively. Eventually, the voltage at the output of the negative integrating driver circuit 51 is equal to the $-V_{IN}$, i.e., the negative of the voltage $V_{IN}$ between the terminals 54, 56. At this point, the voltage of the first test terminal 54 will be 0 volts, which is applied to the input of the negative integrating driver circuit 51. The negative integrating driver circuit 51 therefore stops integrating to maintain the voltage at the test terminal 56 at the negative of the voltage $V_{IN}$ between the terminals 54, 56. The output voltage $V_{OUT}$ taken between the terminals 58, 59 then has a value that is the inverse of the voltage $V_{IN}$ being measured. For example, if +5 volts is applied between the terminals 54, 56, the output of the negative integrating driver circuit 51 will be −5 volts. At this point, the voltage at the terminal 54 referenced to ground will be 0 volts. As a result, the negative integrating driver circuit 51 will stop further integrating so that the voltage $V_{OUT}$ between the output terminals 58, 59 will be maintained at −5 volts. The negative integrating driver circuit 51 can have an integration time constant that is short enough to provide the amplifier circuit with adequate high-frequency response. Thus, changes in the voltage applied between the test terminals 54, 56 that are within the frequency response of the negative integrating driver circuit 51 do not result in any current flow between the input terminals 54, 56. Therefore, the low frequency input impedance, i.e., de(t)/di(t), at the input terminals 54, 56 is virtually infinite as long as the isolation between either of the input terminals 54, 56 and ground is complete.

Figure 4:
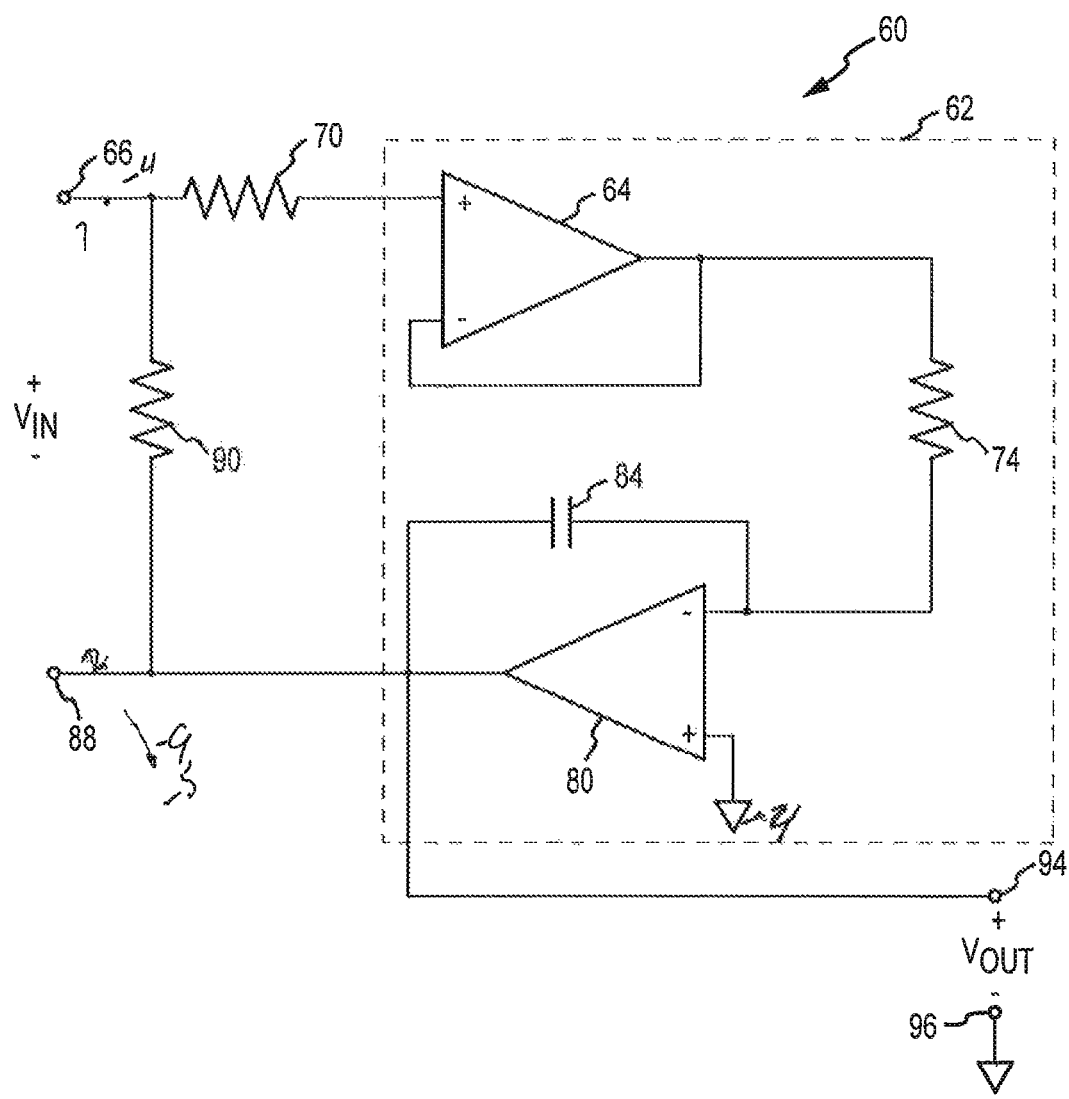
FIG. 4 is an embodiment of an amplifier circuit according to another embodiment of the invention.

An amplifier circuit 60 according to another embodiment of the invention is shown in FIG. 4. The amplifier circuit 60 includes a negative integrating driver circuit 62, which includes an operational amplifier 64 configured as a voltage-follower by coupling its output to its inverting input. The non-inverting input of the amplifier 64 is connected to a first test terminal 66 through a resistor 70, which may have a value of 100 k or any other suitable value. The output of the amplifier 64 is connected through a resistor 74 to an inverting input of another operational amplifier 80. This amplifier 80 has its non-inverting input grounded and its inverting input connected to its output through a capacitor 84 so that it functions as an inverting integrator. The integration time constant is set by the product of the resistance of the resistor 74 and the capacitance of the capacitor 84. In one embodiment, the resistor 74 has a resistance 200 ohms, and the capacitor has a capacitance of 100 picofarads, but other values can be used. By using the operation amplifier 64 as a voltage follower, the integration time of the amplifier 80 can be made proportional to the generally lower resistance of the resistor 74 rather than to the generally higher resistance of the resistor 70. The output of the amplifier 80 is connected to a second test terminal 88. A voltage $V_{IN}$ to be measured is applied between the terminals 66, 88. A resistor 90 is connected between the test terminals 66, 88 to set the input impedance of the amplifier circuit 60. In one embodiment, the resistor 90 has a resistance 1 MΩ, but other values can be used. Also, the resistor 90 can be omitted to provide a virtually infinite low frequency input impedance. A first output terminal 94 of the amplifier circuit 60 is obtained from the output of the amplifier 80, and a second output terminal 96 is connected to ground. An output voltage $V_{OUT}$ is generated between the terminals 94, 96.

In operation, the voltage $V_{IN}$ applied between the test terminals 66, 88 is again applied to the amplifier 80. The amplifier 80 then integrates this voltage negatively. Eventually, the voltage at the output of the amplifier 80 referenced to ground is equal to the voltage $V_{IN}$ between the terminals 66, 88. At this point, the voltage of the first test terminal 66 referenced to ground will be 0 volts, which is applied to the input of the amplifier 80. The amplifier 80 therefore stops integrating to maintain the voltage at the output of the amplifier 80 at the negative of whatever voltage $V_{IN}$ is being measured between the terminals. The output voltage $V_{OUT}$ taken between the terminals 94, 96 then has a value that is the inverse of the voltage $V_{IN}$ being measured. For example, if +5 volts is applied between the terminals 66, 88, the output of the amplifier 64 will be at 5 volts. The amplifier 80 then begins integrating negatively so that the voltage at the output of the amplifier 80 negatively increases, thereby correspondingly reducing the voltage at the test terminal 66 toward 0 volts. When the integration has proceeded to the point that the output of the amplifier 80 is at −5 volts, the voltage at the terminal 66 will be 0 volts. At this point, the amplifier 64 will apply 0 volts to the amplifier 80, which will then stop further integrating so that the voltage $V_{OUT}$ between the output terminals 94, 96 will be maintained at −5 volts referenced to ground. If the test terminals 66, 88 were suddenly shorted, a voltage of −5 volts would be applied to the amplifier 64, which would cause the amplifier 80 to integrate positively toward 0 volts. When the output of the amplifier 80 reached 0 volts, the integration would stop. By appropriately choosing the values of the resistor 74 and the capacitor 84, the integration time can be made sufficiently short that the high-frequency response of the amplifier circuit 60 is adequate.

Figure 5:
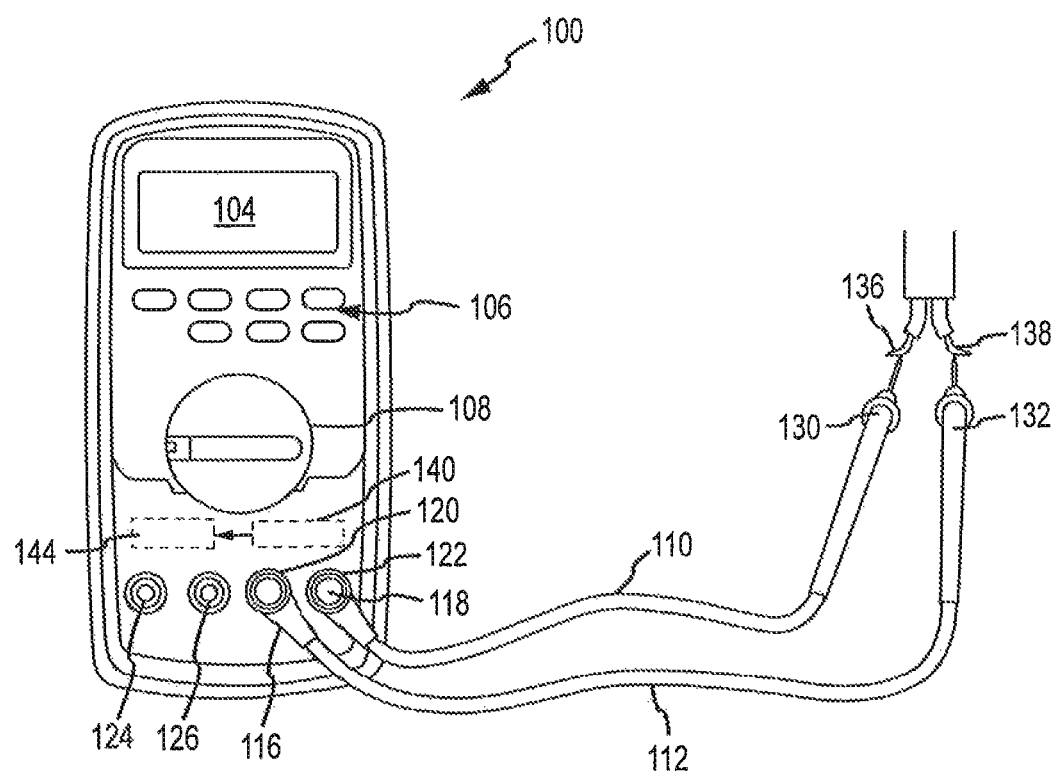
FIG. 5 is a plan view of a multimeter shown measuring an AC voltage using the amplifier circuit of FIG. 3 or 4 or an amplifier circuit according to some other embodiment of the invention.

The amplifier circuit 50 or 60, or an amplifier circuit according to some other embodiment of the invention, is shown used in a multimeter 100 in FIG. 5. The multimeter 100 includes a digital display 104, manually operable buttons 106, and a rotatable mode selector switch 108, which is shown in a position to measure AC voltage. Although the multimeter 100 uses a digital display 104, it will be understood that other types of displays may be used, such as an analog meter (not shown). Also, of course, controls other than the buttons 106 and selector switch 108, may be used. A pair of test leads 110, 112 have plugs 116, 118 that are plugged into respective jacks 120, 122. The plug 118 is inserted into the jack 122 to measure AC or DC voltage, but it is plugged into either of an additional pair of jacks 124, 126 to measure current or resistance, respectively. The plug 116 is inserted into the jack 120 for all measurements. The test leads 110, 112 are connected through respective test probes 130, 132 to respective test points in the form of respective wires 136, 138. The jack 120 is connected to an output terminal of a negative integrating driver circuit 140, which may be the negative integrating driver circuit 51 or 62, or a negative integrating driver circuit according to another embodiment of the invention. The jack 122 is connected to the input of the negative integrating driver circuit 140. An output of the negative integrating driver circuit 140 is connected to appropriate processing circuitry 144, which provides signals to the display 104 to provide a voltage indication.

From the foregoing it will be appreciated that, although specific embodiments of the invention have been described herein for purposes of illustration, various modifications may be made without deviating from the spirit and scope of the invention. For example, the operational amplifier 64 may be omitted so that the test terminal 66 is applied directly to the amplifier 80 through one of the resistors 70 or 74. Other variations will be apparent to one skilled in the art. Accordingly, the invention is not limited except as by the appended claims.

While illustrative embodiments have been illustrated and described, it will be appreciated that various changes can be made therein without departing from the spirit and scope of the invention.

The embodiments of the invention in which an exclusive property or privilege is claimed are defined as follows:

1. A test device, comprising:
   a first test lead;
   a second test lead, the first and second test leads configured to receive an input voltage applied across the first and second test leads;
   an output voltage generator having a first input coupled to the first test lead, a second input coupled to a first fixed voltage, a first output coupled to the second test lead, and a second output coupled to a second fixed voltage, the output voltage generator configured to provide to the second test lead and the first output of the output voltage generator a voltage having a magnitude corresponding to a difference between the magnitude of the first fixed voltage and the magnitude of the input voltage;

a processing circuit coupled to the first and second outputs of the output voltage generator, the processing circuit configured to provide an output signal indicative of a voltage across the first and second outputs of the output voltage generator; and a display coupled to receive the output signal from the processing circuit and configured to provide a visual display indicative of the magnitude of the output signal.

2. The test device of claim 1, further comprising an input resistor coupled between the first test lead and the second test lead.

3. The test device of claim 1 wherein the first fixed voltage has a magnitude that is equal to the magnitude of the second fixed voltage.

4. The test device of claim 1 wherein the output voltage generator comprises a negative integrating driver circuit configured to integrate voltage applied a voltage having a magnitude that is equal to the magnitude of the input voltage applied across the first and second test leads, the integration being at a polarity opposite the polarity of the input voltage, and the negative integrating driver circuit providing an output voltage to the first output that is indicative of the integration.

5. The test device of claim 4 wherein the negative integrating driver circuit comprises:

an amplifier having a gain, the amplifier having a first an input coupled to the first test lead, and an output; and an integrator having a first input coupled to the output of the amplifier, a second input coupled to the first fixed voltage, and an output coupled to the second test lead, wherein the integrator is configured to integrate a voltage received from the output of the amplifier to provide the output voltage to the output coupled to the second test lead, the integrator having an integration polarity that is opposite a polarity of the gain of the amplifier.

6. The test device of claim 5 wherein the amplifier comprises an operational amplifier having an inverting input connected to an output of the operational amplifier, and a non-inverting input coupled to the first test lead.

7. The test device of claim 5 wherein the amplifier is a first amplifier, and wherein the integrator comprises:

a second amplifier having an inverting input, a non-inverting input coupled to the first fixed voltage, and the output coupled to the second test lead;

a resistor coupled between the inverting input of the second amplifier and the output of the first amplifier; and a capacitor coupled between the inverting input and the output of the second amplifier.

8. The method of claim 1 wherein the first fixed voltage and the second fixed voltage are ground.

9. A method of measuring a signal, the method comprising:

receiving an input voltage across first and second input terminals, wherein the input voltage is the difference between a first voltage at the first input terminal and a second voltage at the second input terminal;

generating an output voltage having a magnitude that corresponds to a difference between the magnitude of the input voltage and the magnitude of a fixed voltage;

applying the output voltage to the second input terminal thereby causing the voltage at the first input terminal to be equal to the fixed voltage; and providing the output voltage to a processing circuit.

10. The method of claim 9 wherein generating the output voltage comprises integrating an intermediate voltage with respect to time.

11. The method of claim 10 wherein the intermediate voltage initially has a magnitude that is equal to the magnitude of the input voltage.

12. The method of claim 9 wherein the second voltage initially is the fixed voltage.

13. The method of claim 9 wherein generating the output voltage comprises generating an output voltage having a magnitude that corresponds to a difference between the magnitude of the input voltage and the magnitude of the second voltage.

14. The method of claim 9 wherein the fixed voltage is ground.

\* \* \* \* \*

UNITED STATES PATENT AND TRADEMARK OFFICE
CERTIFICATE OF CORRECTION

PATENT NO.         : 8,228,054 B2                                          Page 1 of 1
APPLICATION NO.    : 13/088150
DATED              : July 24, 2012
INVENTOR(S)        : H. Yao It is certified that error appears in the above-identified patent and that said Letters Patent is hereby corrected as shown below:

In the Claims

| COLUMN | LINE | ERROR |
| --- | --- | --- |
| 5 (Claim 4) | 24 | after "integrated" please delete "voltage applied" |
| 5 (Claim 5) | 32 | after "amplifier having" please delete "a first" |

Signed and Sealed this
Second Day of July, 2013

Teresa Stanek Rea
*Acting Director of the United States Patent and Trademark Office*